(12) United States Patent
Lee et al.

(10) Patent No.: US 8,298,892 B1
(45) Date of Patent: Oct. 30, 2012

(54) FABRICATING METHOD OF INSULATOR

(75) Inventors: Tzung-Han Lee, Taipei (TW);
Chung-Lin Huang, Taoyuan County (TW); Ron Fu Chu, Taipei (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 0 days.

(21) Appl. No.: 13/241,295

(22) Filed: Sep. 23, 2011

(30) Foreign Application Priority Data

Sep. 14, 2011 (TW) ................ 100133049

(51) Int. Cl.
*H01L 21/336* (2006.01)
(52) U.S. Cl. ............. 438/259; 438/589; 257/E21.655
(58) Field of Classification Search .......... 438/259, 438/270–271, 589; 257/330, E21.655
See application file for complete search history.

(56) References Cited

U.S. PATENT DOCUMENTS

| 2008/0211057 | A1 | 9/2008 | Lee |
| 2010/0127323 | A1* | 5/2010 | Chung et al. ............. 257/334 |
| 2010/0148233 | A1 | 6/2010 | Fujimoto |
| 2010/0213541 | A1 | 8/2010 | Jeon |

* cited by examiner

*Primary Examiner* — Thanhha Pham
(74) *Attorney, Agent, or Firm* — Winston Hsu; Scott Margo

(57) ABSTRACT

A fabricating method of an insulator for replacing a gate structure in a substrate by the insulator. The fabricating method includes the step of providing a substrate including a first buried gate structure. The first buried structure includes a first trench embedded in the substrate and a first gate filling in the first trench. The first trench has a first depth. Then, the first gate of the first buried structure is removed. Later, the substrate under the first trench is etched to elongate the depth of the first trench from the first depth to a third depth. Finally, an insulating material fills in the first trench with the third depth to form an insulator of the present invention.

8 Claims, 8 Drawing Sheets

FABRICATING METHOD OF INSULATOR

BACKGROUND OF THE INVENTION

1. Field of the Invention

The present invention generally relates to a fabricating method of an insulator. In particular, the present invention is directed to a fabricating method of an insulator for use between two gate structures.

2. Description of the Prior Art

With the increasing integration density of semiconductors, a metal-oxide-semiconductor field-effect transistor (MOSFET) has evolved from a flat MOSFET to an embedded MOSFET in order to scale down the volume. An MOSFET usually includes a gate structure as well as a diffusion region. The diffusion region is often referred to as a source region or a drain region in accordance with the operation of the transistor.

An embedded MOSFET generally includes a conductive gate reaching to a trench in the Si substrate, and a dielectric layer is disposed between the conductive gate and the Si substrate to electrically insulate the conductive gate and the Si substrate. In operation, each MOSFET is controlled by a voltage which is applied to the gates. Once the voltage is higher than a threshold voltage, a current is generated around the periphery of the trench.

Sometimes, some insulators are placed between the MOSFETs to keep two neighboring MOSFETs from being electrically connected. The insulators are usually called insulating gate transistors, whose structures are roughly similar to other embedded MOSFETs. However, by applying a suitable bias to an insulating gate transistor, usually a negative bias, the insulating gate transistor can possibly become an open circuit permanently, in an off-state. In such a way, it may serve as an insulator.

In the light of the increasing scaling down of integrated circuits, an insulator of smaller volume is needed to reduce the occupancy and to save more space, and to further enhance the insulating ability of the insulator.

SUMMARY OF THE INVENTION

In view of this, one object of the present invention is to enhance the insulating ability of a conventional insulator and to increase the integration density of semiconductors.

In accordance with one preferred embodiment of the present invention, a fabricating method of an insulator is proposed. First, a substrate including a first buried gate structure and a second buried gate structure is provided. The first buried structure includes a first trench embedded in the substrate, a first gate dielectric layer disposed on the inner sidewall of the first trench, and a first gate filling the first trench of a first depth. Second, a patterned mask covering the second buried gate structure and exposing the first buried gate structure of the first depth is formed. Then, the first gate of the first buried structure is removed by using the patterned mask as a shield. Later, the substrate under the first trench is etched so that the first trench is elongated from the first depth to a third depth. Next, the patterned mask is removed. Afterwards, an insulating material is formed to fill the first trench of the third depth to form an insulator.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
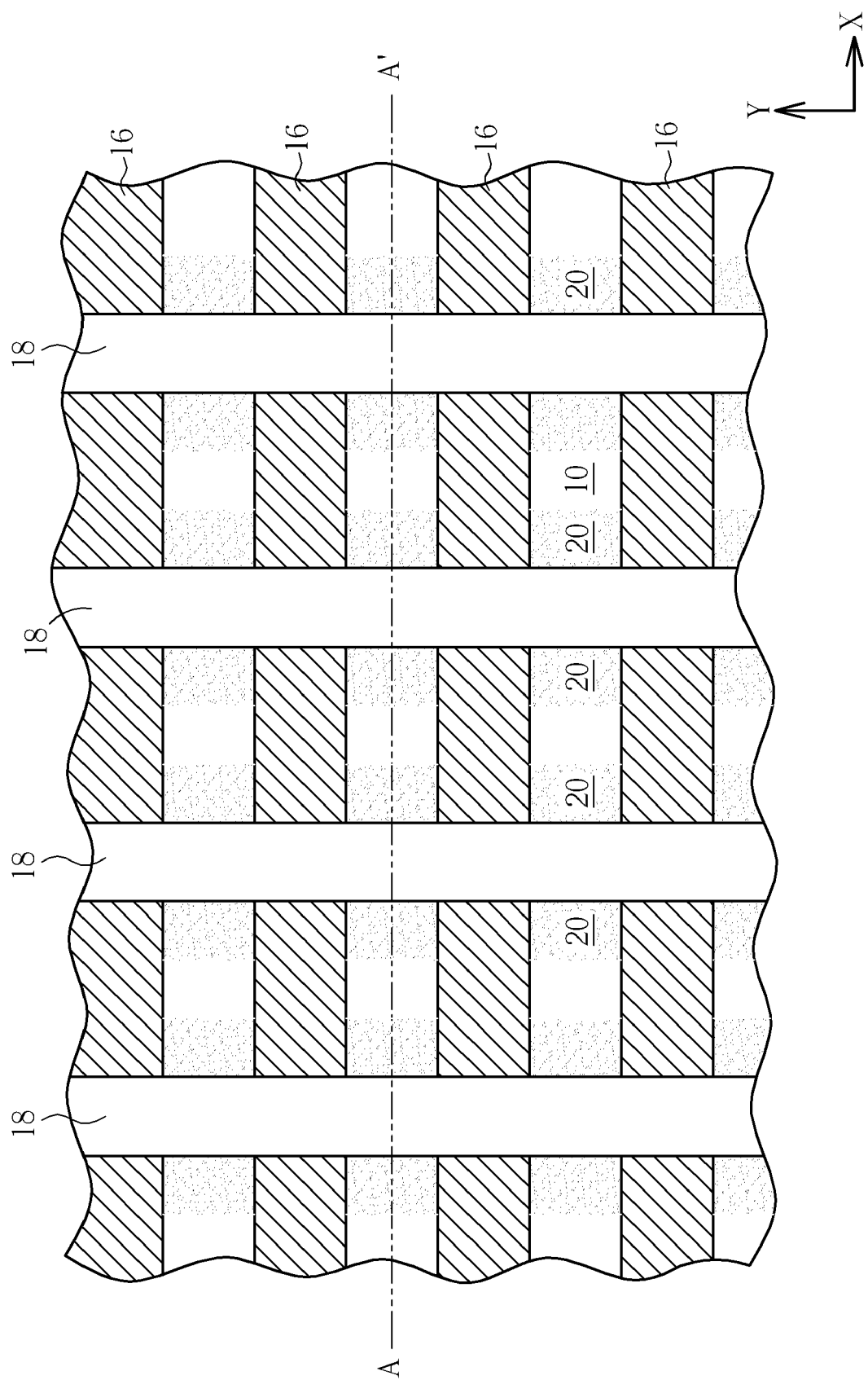
FIGS. 1-7 illustrate a fabricating method of an insulator in accordance with a preferred embodiment of the present invention.

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals. In addition, in embodiments the source and the drain can be exchanged.

Figure 2:
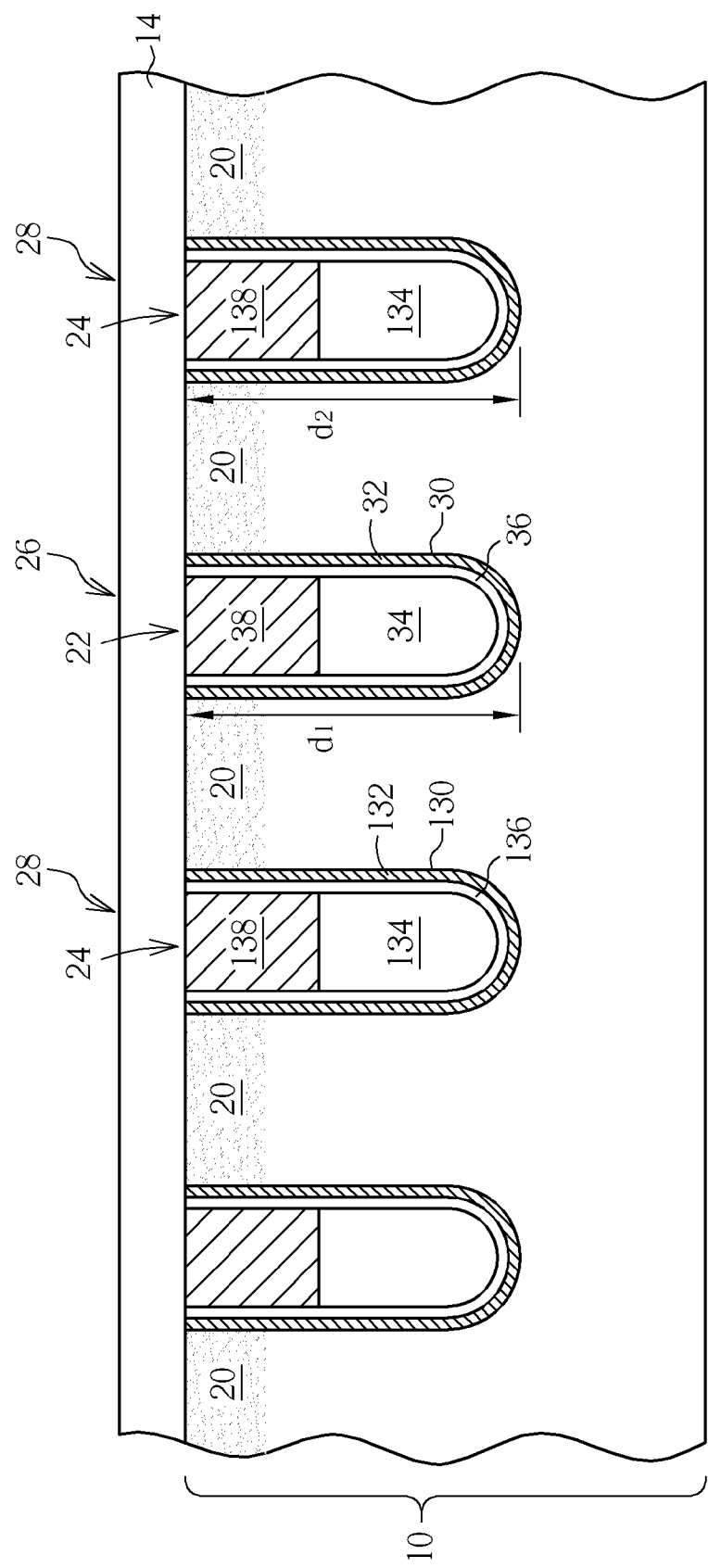
Figure 5:
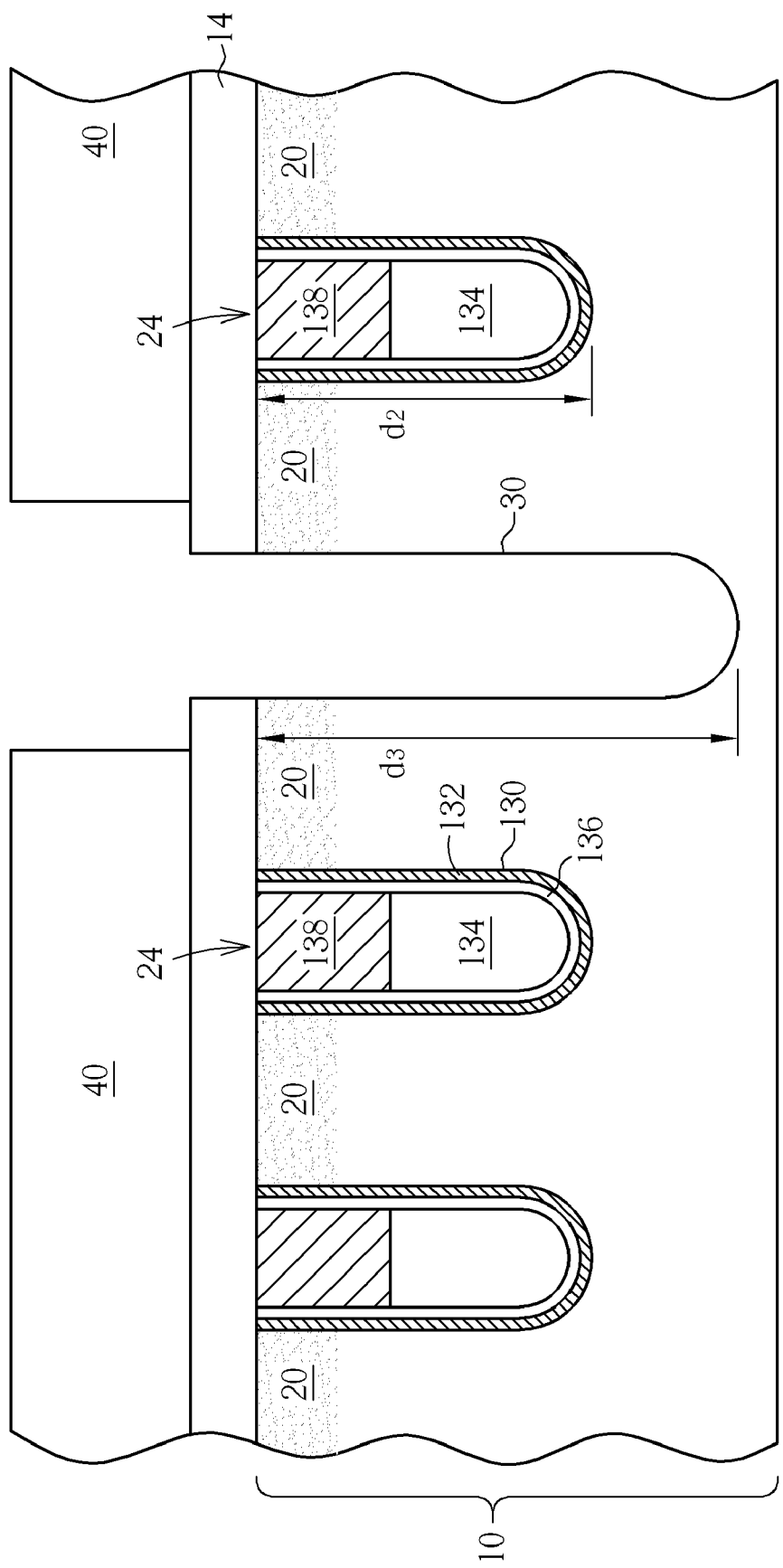
Figure 6:
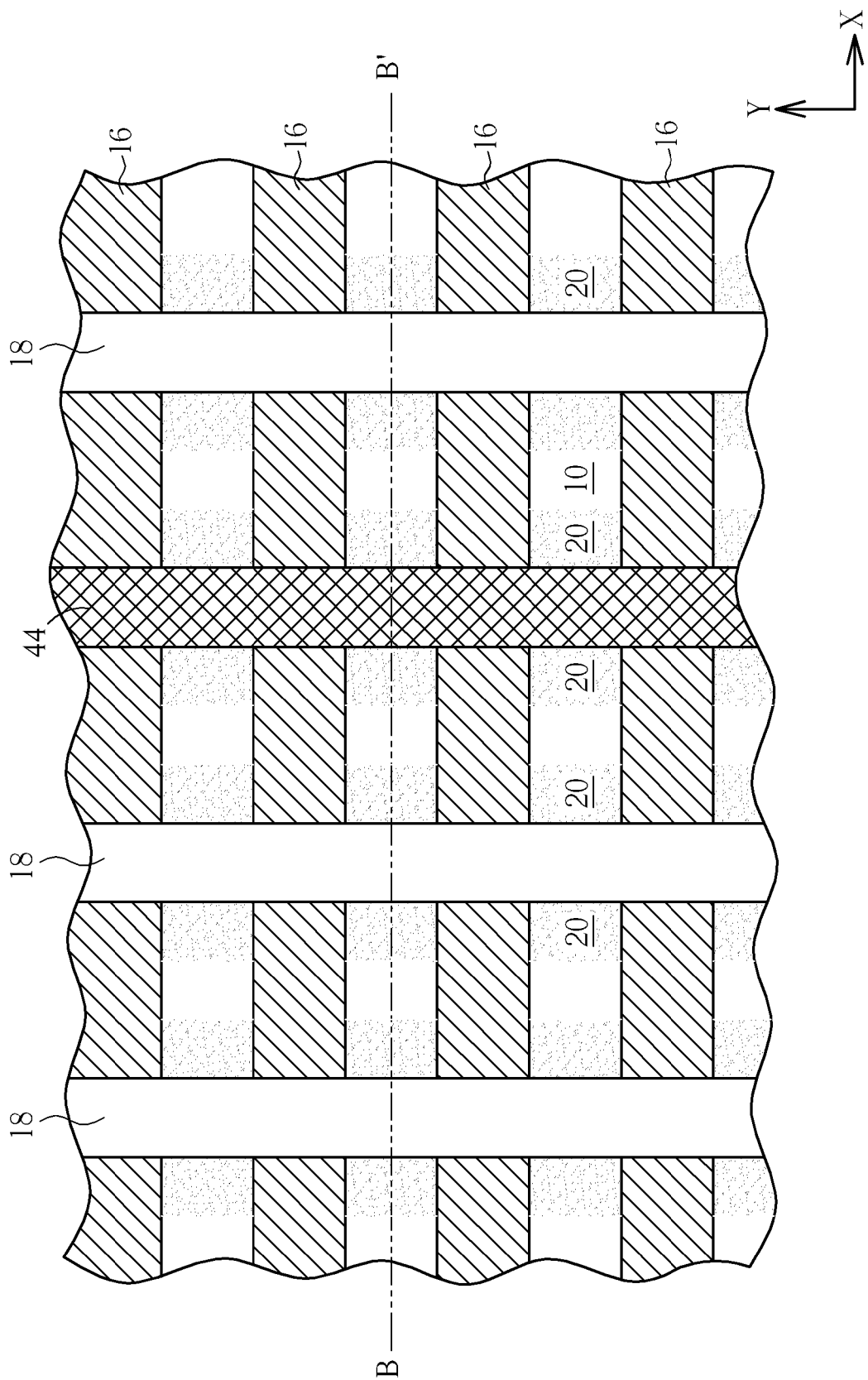
Figure 7:
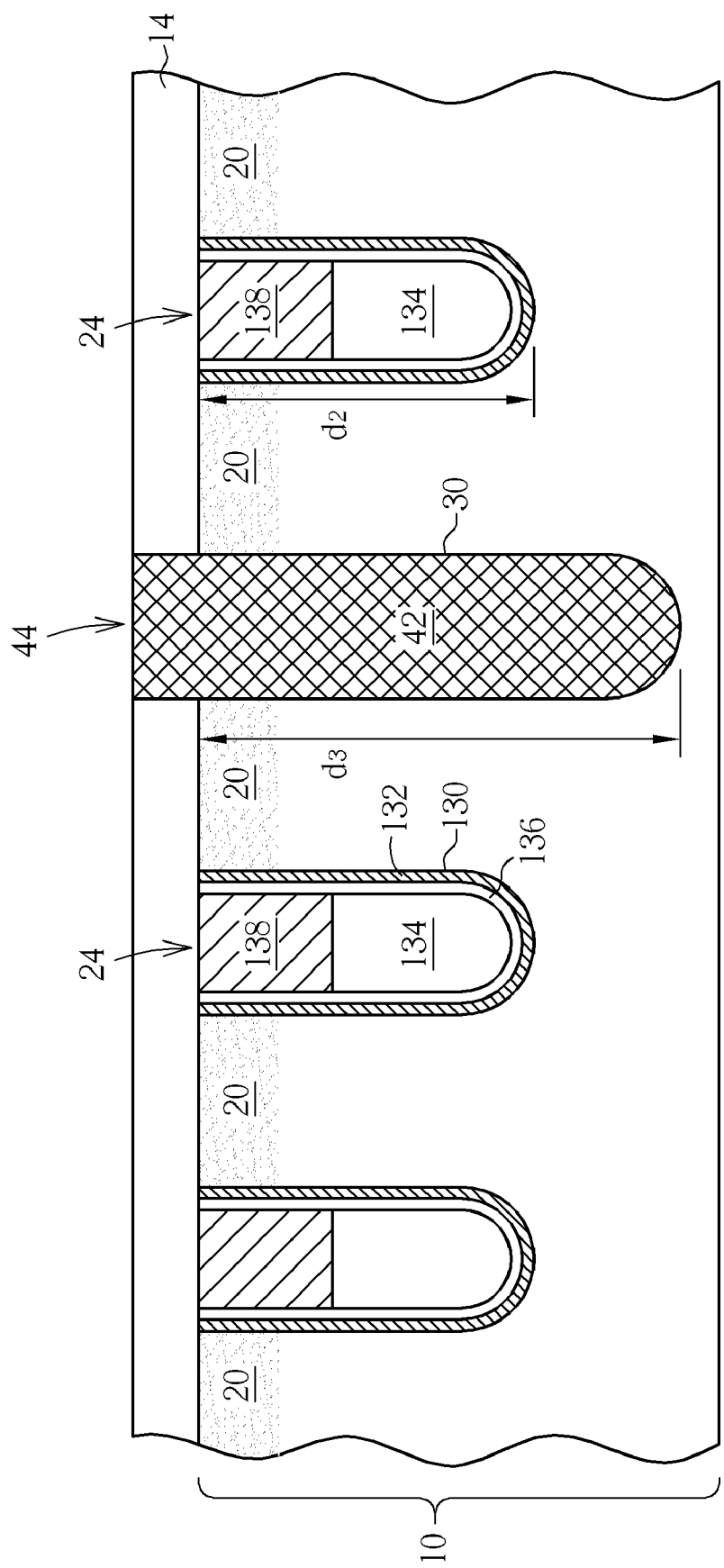
Figure 8:
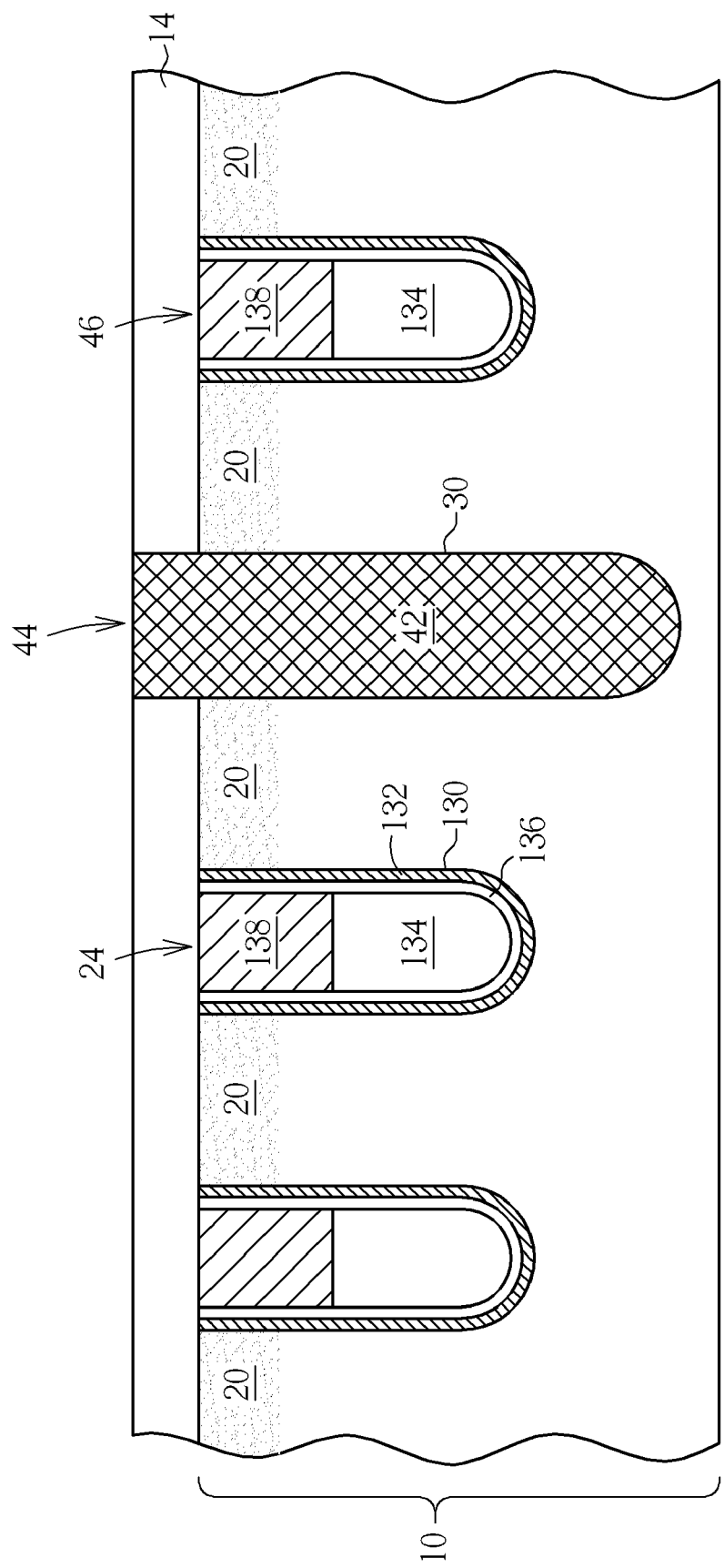
FIG. 8 illustrates an application of the insulator in accordance with a preferred embodiment of the present invention.

FIGS. 1-7 illustrate a fabricating method of an insulator in accordance with a preferred embodiment of the present invention. FIG. 1 illustrates a top view of the trench-type gate transistor array. FIG. 2 illustrates a side view of the trench-type gate transistor array along the line A-A' in FIG. 1. FIG. 6 illustrates a top view of the trench-type gate transistor array and the insulator. FIG. 7 illustrates a side view of the trench-type gate transistor array and the insulator along the line B-B' in FIG. 7. FIG. 8 illustrates an application of the insulator in accordance with a preferred embodiment of the present invention.

Please refer to FIGS. 1 and 2 at the same time. First, a substrate 10 is provided. The substrate 10 includes a Si substrate, an SIO substrate or any semiconductive material including Si, Ge, SiGe or SiC. There maybe a nitride layer 14 disposed on the substrate 10. Then, multiple shallow trench isolations 16 are formed in the substrate 10. The shallow trench isolations 16 extend along the X direction. Later, multiple word lines 18 are formed along the Y direction, and a source/drain doping region 20 are formed in the substrate 10 adjacent to two sides of each word line 18. The X direction and the Y direction intersect.

Please continue to refer to FIG. 2. The word line 18 which is sandwiched between the source/drain doping regions 20 is a buried gate structure, for example a first buried gate structure 22 and at least a second buried gate structure 24. The first buried gate structure 22 and the adjacent source/drain doping region 20 together form a first buried MOSFET 26. The second buried gate structure 24 and the adjacent source/drain doping region 20 together forma second buried MOSFET 28. Later, the first buried gate structure 22 will be replaced by an insulator (not shown). Optionally, the first buried gate structure 22 may be next to at least one second buried gate structure 24. In this step, the first buried gate structure 22 and the second buried gate structure 24 both have the same structure. To be more detailed, the first buried gate structure 22 includes a first trench 30 buried in the substrate 10. At this moment, the first trench 30 has a first depth $d_1$. A first gate dielectric layer 32 is disposed on the inner sidewall of the first trench 30. A first gate 34 fills the first trench 30. In addition, each second buried gate structure 24 includes a second trench 130 buried in the substrate 10. The second trench 130 has a second depth $d_2$. A second gate dielectric layer 132 is disposed on the inner sidewall of the second trench 130. A second gate 134 fills the second trench 130. To be noticed, the first trench 30 and the second trench 130 have the same depth. In other words, the first depth $d_1$ and the second depth $d_2$ are the same.

Preferably, the first gate 34 and the second gate 134 preferably include tungsten. In addition, there maybe an optional buffer layer 36/136, silicon nitride for example, disposed between the first gate dielectric layer 32 and the first gate 34, and between the second gate dielectric layer 132 and the second gate 134. Moreover, there may be a gate cap layer 38/138 respectively disposed on the first gate 34 the second gate 134. The gate cap layer 38/138 may include silicon oxide. The first gate dielectric layer 32 and the second gate dielectric layer 132 may preferably include silicon oxide.

Figure 3:
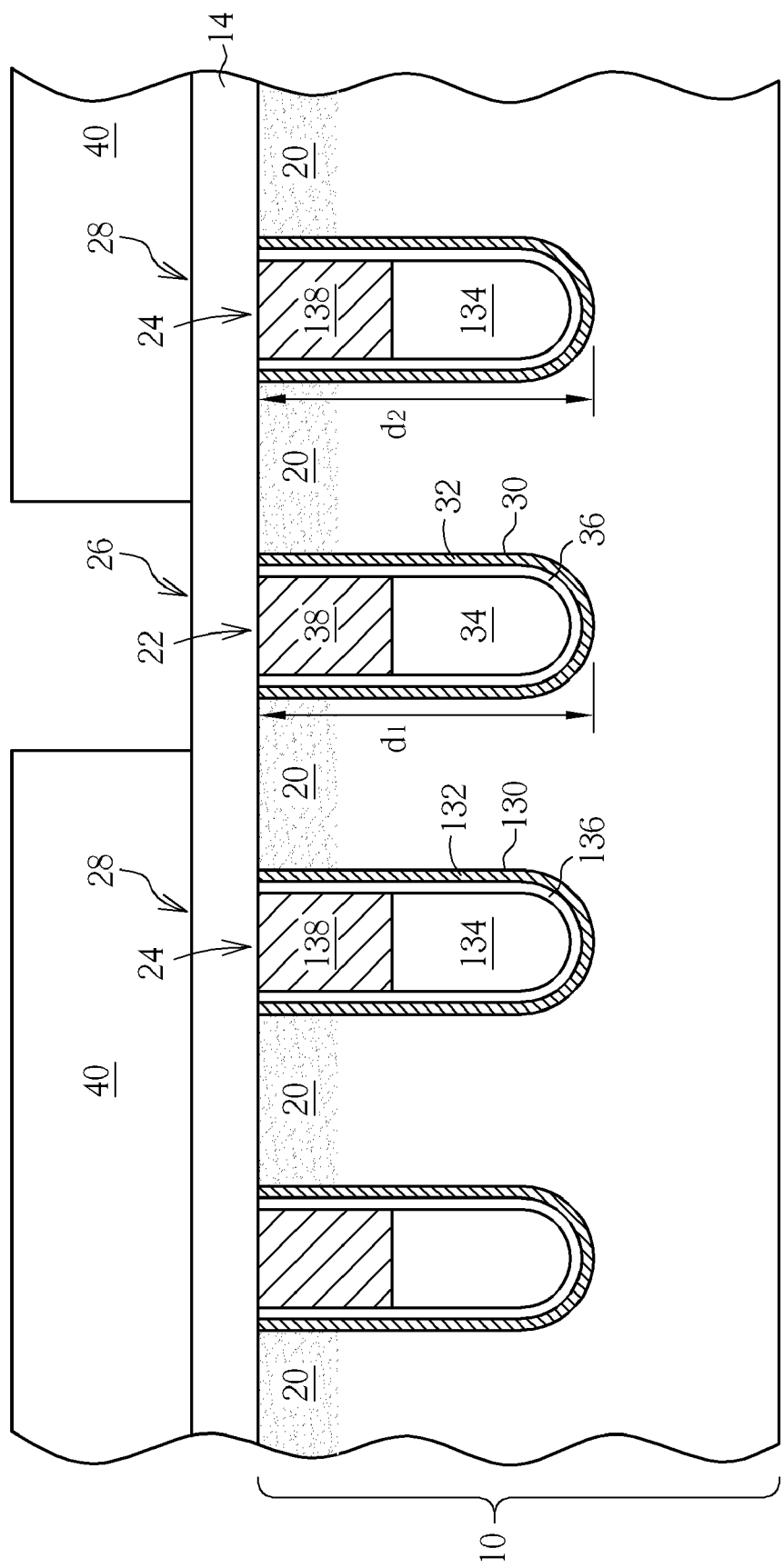
Figure 4:
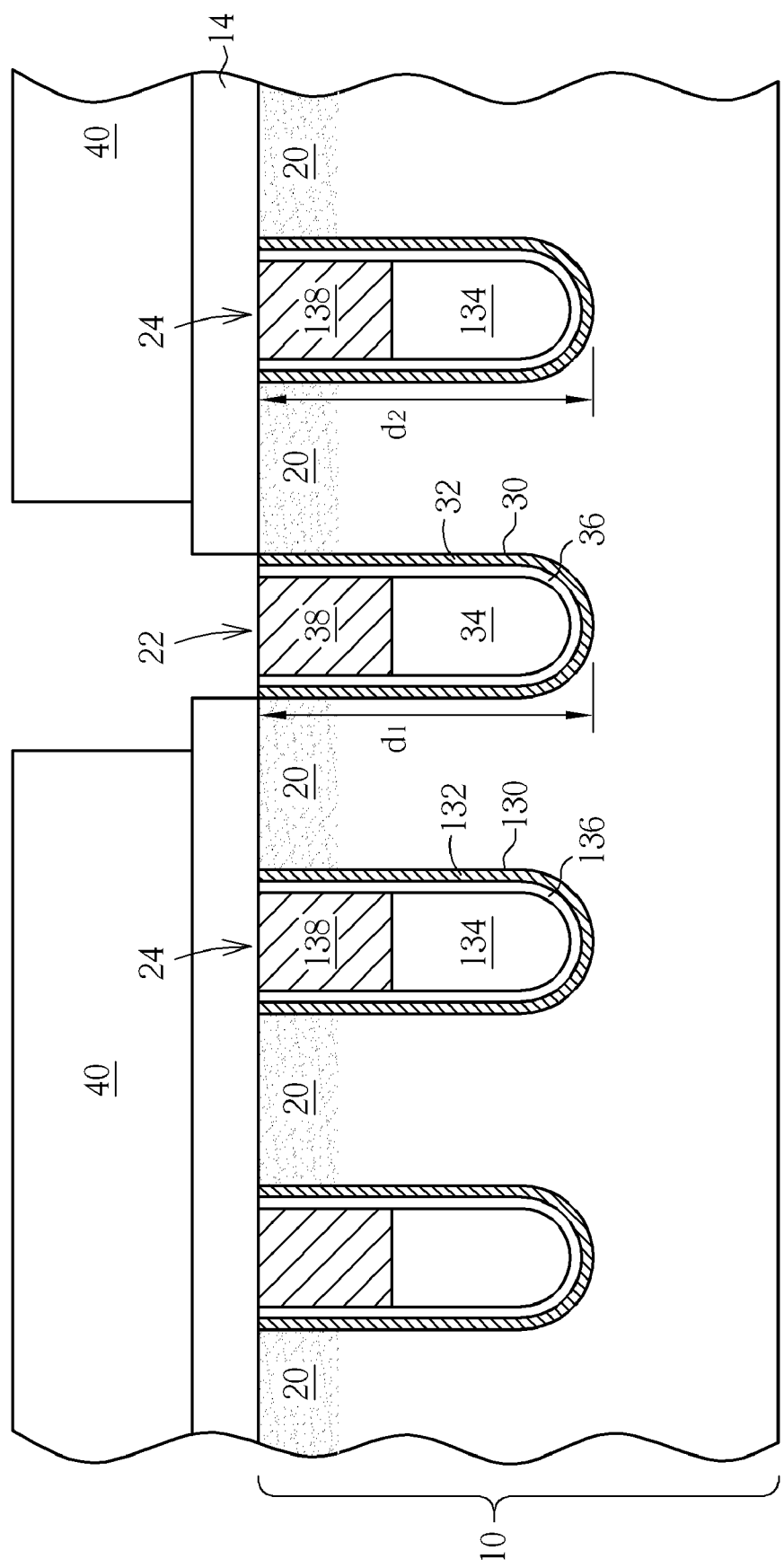

As shown in FIG. 3, a patterned mask 40 which covers the second buried gate structure 24 and exposes the first buried gate structure 22 of the first depth $d_1$ is formed. Then, an etching step is carried out so that part of the silicon nitride 14, the gate cap layer 38 in the first trench 30 and part of the first gate dielectric layer 32 are etched by using the patterned mask 40 as a shield. Later, as shown in FIG. 5, the etching step continues to etch the first gate 34 till the first gate 34 is totally removed by another etchant. Further, the etching step continues to etch the substrate 10 under the first trench 30 by still another etchant so that the depth of the first trench 30 increases from the first depth $d_1$ to a third depth $d_3$. In other words, after the etching step, the depth of the first trench 30 is greater than that of the adjacent second trench 130. That is, the third depth $d_3$ is greater than the second depth $d_2$.

As shown in FIGS. 6 and 7, the patterned mask 40 is removed and an insulating material 42 is used to fill the first trench 30 of the third depth $d_3$. The insulating material 42 maybe silicon oxide. So far, the insulator 44 of the present invention is done. Please also notice that the insulator 44 extends along the Y direction, too.

Furthermore, the insulator 44 of the present invention not only may be placed between two buried gate structures, but also may be used as the isolation of other semiconductor elements. As shown in FIG. 8, the insulator 44 of the present invention may be located between a buried gate structure 24 and a capacitor 46.

Please refer to FIGS. 2 and 7. The insulator of the present invention replaces the original buried gate structure to keep the second buried gate structures adjacent to the insulator from leaking current. Since the insulator is deeper than the adjacent second buried gate structures, a better isolation is enabled and no additional bias is needed like the traditional insulating gate transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of an insulator, comprising:
providing a substrate comprising a first buried gate structure and a second buried gate structure, wherein said first buried structure comprises a first trench having a first depth and embedded in said substrate, a first gate dielectric layer disposed on the inner sidewall of said first trench, a first gate filling said first trench;
forming a patterned mask covering said second buried gate structure and exposing said first buried gate structure having said first depth;
removing said first gate of said first buried structure by using said patterned mask as a mask;
etching said substrate under said first trench so that said first trench is elongated from said first depth to a third depth;
removing said patterned mask; and
forming an insulating material which fills said first trench of said third depth to form an insulator.

2. The fabricating method of an insulator of claim 1, wherein said second buried gate structure comprises a second trench having a second depth and said third depth is greater than said second depth.

3. The fabricating method of an insulator of claim 1, wherein said first depth is as deep as said second depth.

4. The fabricating method of an insulator of claim 1, wherein said first buried structure further comprises a gate cap layer disposed in said first trench and above said first gate before etching said substrate under said first trench.

5. The fabricating method of an insulator of claim 4, further comprising:
removing said gate cap layer before removing said first gate of said first buried structure.

6. The fabricating method of an insulator of claim 4, wherein said gate cap layer and said first gate dielectric layer both have silicon oxide.

7. The fabricating method of an insulator of claim 1, wherein silicon nitride is disposed on said substrate.

8. The fabricating method of an insulator of claim 1, wherein two doping regions are disposed in said substrate and adjacent to two sides of said insulator.

* * * * *